(12) United States Patent
Katsuta

(10) Patent No.: US 12,340,617 B2
(45) Date of Patent: *Jun. 24, 2025

(54) DETECTION DEVICE AND DISPLAY DEVICE

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,630

(22) Filed: Apr. 11, 2024

(65) Prior Publication Data

US 2024/0257551 A1 Aug. 1, 2024

Related U.S. Application Data

(63) Continuation of application No. 17/880,960, filed on Aug. 4, 2022, now Pat. No. 11,961,323.

(30) Foreign Application Priority Data

Aug. 16, 2021 (JP) .................................. 2021-132374

(51) Int. Cl.
*G06V 40/13* (2022.01)
*G09G 3/3225* (2016.01)
*G09G 3/3266* (2016.01)
*H10F 39/00* (2025.01)
(Continued)

(52) U.S. Cl.
CPC ....... *G06V 40/1318* (2022.01); *G09G 3/3225* (2013.01); *G09G 3/3266* (2013.01); *H10F 39/802* (2025.01); *G06V 40/145* (2022.01); *G09G 2310/0286* (2013.01); *H10F 39/18* (2025.01)

(58) Field of Classification Search
CPC ........ G06V 40/12–1394; G06V 40/145; H01L 27/14603; H01L 27/14643; G09G 3/3225; G09G 3/3266; G06F 3/042–0428
See application file for complete search history.

(56) References Cited

U.S. PATENT DOCUMENTS

2002/0196036 A1* 12/2002 Toyoshima ........ G06V 40/1306
324/702
2006/0001752 A1 1/2006 Yanagisawa et al.
(Continued)

FOREIGN PATENT DOCUMENTS

JP 2006019927 1/2006
JP 2006085559 A 3/2006

OTHER PUBLICATIONS

Japanese Office Action issued Feb. 12, 2025 in corresponding Japanese Application No. 2021-132374.

*Primary Examiner* — Hang Lin
(74) *Attorney, Agent, or Firm* — K&L Gates LLP

(57) ABSTRACT

A detection device includes a plurality of detection elements arranged in a matrix having a row-column configuration in a detection area, a plurality of scan lines each coupled to the detection elements arranged in a first direction, a drive circuit configured to drive the scan lines, a plurality of output signal lines each coupled to the detection elements arranged in a second direction different from the first direction, and a detection circuit configured to be supplied with detection signals from the detection elements through the output signal lines.

18 Claims, 13 Drawing Sheets

(51) Int. Cl.
*G06V 40/145* (2022.01)
*H10F 39/18* (2025.01)

(56) References Cited

U.S. PATENT DOCUMENTS

| | | | |
|---|---|---|---|
| 2015/0270011 A1* | 9/2015 | Umezaki | G11C 19/28 377/64 |
| 2019/0377446 A1* | 12/2019 | Lin | G06V 40/1318 |
| 2020/0012833 A1* | 1/2020 | Jin | G06V 40/1329 |

* cited by examiner

DETECTION DEVICE AND DISPLAY DEVICE

CROSS-REFERENCE TO RELATED APPLICATION

The present application is a continuation of U.S. patent application Ser. No. 17/880,960 filed on Aug. 4, 2022, which application claims the benefit of priority from Japanese Patent Application No. 2021-132374 filed on Aug. 16, 2021, the entire contents of which are incorporated herein by reference.

BACKGROUND

1. Technical Field

The present disclosure relates to a detection device and a display device.

2. Description of the Related Art

Optical detection devices are known in which a plurality of photoelectric conversion elements such as positive-intrinsic-negative (PIN) photodiodes are arranged on a substrate. Such an optical detection device is used as, for example, a biometric sensor, such as a fingerprint sensor or a vein sensor, that detects biological information. The photoelectric conversion elements are separately arranged at an arrangement pitch corresponding to a resolution of detection (The related technologies are described, for example, in Japanese Patent Application Laid-open Publication No. 2006-85559).

In a configuration in which a common scan line drives a plurality of photoelectric conversion elements, detection values may differ due to differences in time constant generated in drive signals caused by differences in wiring length of the scan line.

It is an object of the present disclosure to provide a detection device and a display device capable of reducing the differences in the detection values.

SUMMARY

A detection device according to an embodiment of the present disclosure includes a plurality of detection elements arranged in a matrix having a row-column configuration in a detection area, a plurality of scan lines each coupled to the detection elements arranged in a first direction, a drive circuit configured to drive the scan lines, a plurality of output signal lines each coupled to the detection elements arranged in a second direction different from the first direction, and a detection circuit configured to be supplied with detection signals from the detection elements through the output signal lines. The scan lines comprise reset control scan lines each configured to supply a reset control signal to apply a reset potential to the detection elements arranged in the first direction, and the drive circuit includes a first transistor configured to apply a first potential to each of the reset control scan lines, a second transistor that is coupled in series to the first transistor, and is configured to apply a second potential lower than the first potential to the reset control scan line, and a third transistor that is coupled in parallel to the second transistor, and is configured to apply the second potential to the reset control scan line.

A display device according to an embodiment of the present disclosure includes a plurality of display elements arranged in a matrix having a row-column configuration in a display area, a plurality of scan lines each coupled to the display elements arranged in a first direction, and a drive circuit configured to drive the scan lines. The drive circuit includes a first transistor configured to apply a first potential to each of the scan lines, a second transistor that is coupled in series to the first transistor, and is configured to apply a second potential lower than the first potential to the scan line, and a third transistor that is coupled in parallel to the second transistor, and is configured to apply the second potential to the scan line.

DETAILED DESCRIPTION

Figure 1:
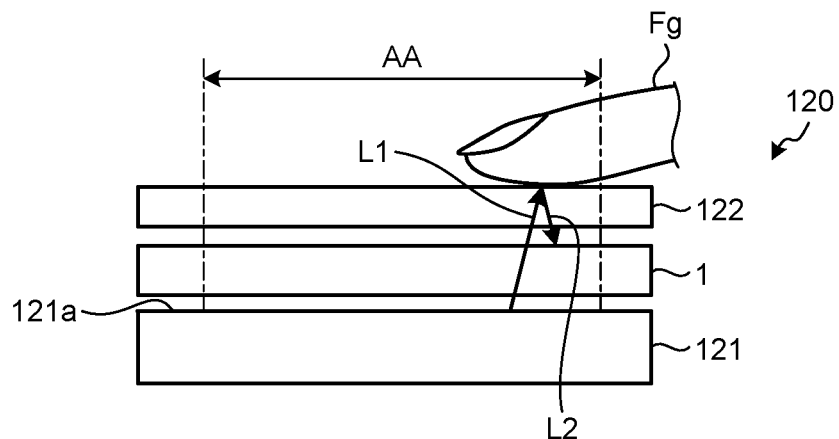
FIG. 1 is a sectional view illustrating a schematic sectional configuration of a detection apparatus having an illumination device, the detection apparatus including a detection device according to an embodiment.

The following describes a mode (embodiment) for carrying out the present disclosure in detail with reference to the drawings. The present disclosure is not limited to the description of the embodiment to be given below. Components to be described below include those easily conceivable by those skilled in the art or those substantially identical thereto. In addition, the components to be described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

Embodiment

FIG. 1 is a sectional view illustrating a schematic sectional configuration of a detection apparatus having an illumination device, the detection apparatus including a detection device according to an embodiment. As illustrated in FIG. 1, a detection apparatus 120 having an illumination device includes a detection device 1, an illumination device 121, and a cover glass 122. The illumination device 121, the detection device 1, and the cover glass 122 are stacked in this order in a direction orthogonal to a surface of the detection device 1.

The illumination device 121 has a light-emitting surface 121a for emitting light, and emits light L1 from the light-emitting surface 121a toward the detection device 1. The illumination device 121 is a backlight. The illumination device 121 may be, for example, what is called a side light-type backlight that includes a light guide plate provided in a position corresponding to a detection area AA and a plurality of light sources arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly below the detection area AA. The illumination device 121 is not limited to the backlight, and may be provided on a lateral side or an upper side of the detection device 1, and may emit the light L1 from the lateral side or the upper side of a finger Fg.

The detection device 1 is provided so as to face the light-emitting surface 121a of the illumination device 121. The light L1 emitted from the illumination device 121 passes through the detection device 1 and the cover glass 122. The detection device 1 is, for example, a light-receptive biometric sensor, and can detect asperities (such as a fingerprint) on a surface of the finger Fg by detecting light L2 reflected on the surface the finger Fg. Alternatively, the detection device 1 may detect information on a living body by detecting the light L2 reflected inside the finger Fg in addition to detecting the fingerprint. Examples of the information on the living body include a blood vessel image, pulsation, and a pulse wave of, for example, a vein. The color of the light L1 from the illumination device 121 may be varied according to a detection target.

The cover glass 122 is a member for protecting the detection device 1 and the illumination device 121, and covers the detection device 1 and the illumination device 121. The cover glass 122 is, for example, a glass substrate. The cover glass 122 is not limited to a glass substrate, and may be, for example, a resin substrate. The cover glass 122 need not be provided. In this case, the surface of the detection device 1 is provided with a protective layer, and the finger Fg contacts the protective layer of the detection device 1.

The detection apparatus 120 having an illumination device may be provided with a display panel instead of the illumination device 121. The display panel may be, for example, an organic electroluminescent (EL) (organic light-emitting diode (OLED)) display panel or an inorganic EL (micro-LED or mini-LED) display. Alternatively, the display panel may be a liquid crystal display (LCD) panel using liquid crystal elements as display elements or an electrophoretic display (EPD) panel using electrophoretic elements as display elements. Also, in this case, display light emitted from the display panel passes through the detection device 1, and the fingerprint of the finger Fg and the information on the living body can be detected based on the light L2 reflected by the finger Fg.

Figure 2:
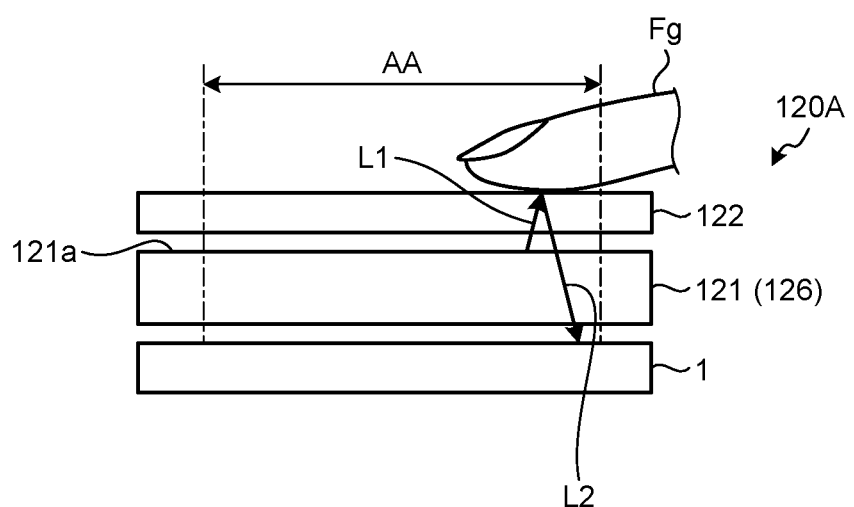
FIG. 2 is a sectional view illustrating a schematic sectional configuration of a detection apparatus having an illumination device according to a modification.

FIG. 2 is a sectional view illustrating a schematic sectional configuration of a detection apparatus having an illumination device according to a modification. As illustrated in FIG. 2, in the detection apparatus 120 having an illumination device, the detection device 1, the illumination device 121, the cover glass 122 are stacked in this order in the direction orthogonal to the surface of the detection device 1. Also, in the present modification, a display panel such as an organic EL display panel 126 can be employed instead of the illumination device 121.

The light L1 emitted from the illumination device 121 passes through the cover glass 122, and then, is reflected by the finger Fg. The light L2 reflected by the finger Fg passes through the cover glass 122, and further passes through the illumination device 121. The detection device 1 can perform the detection of the information on the living body such as the fingerprint detection by receiving the light L2 that has passed through the illumination device 121.

Figure 3:
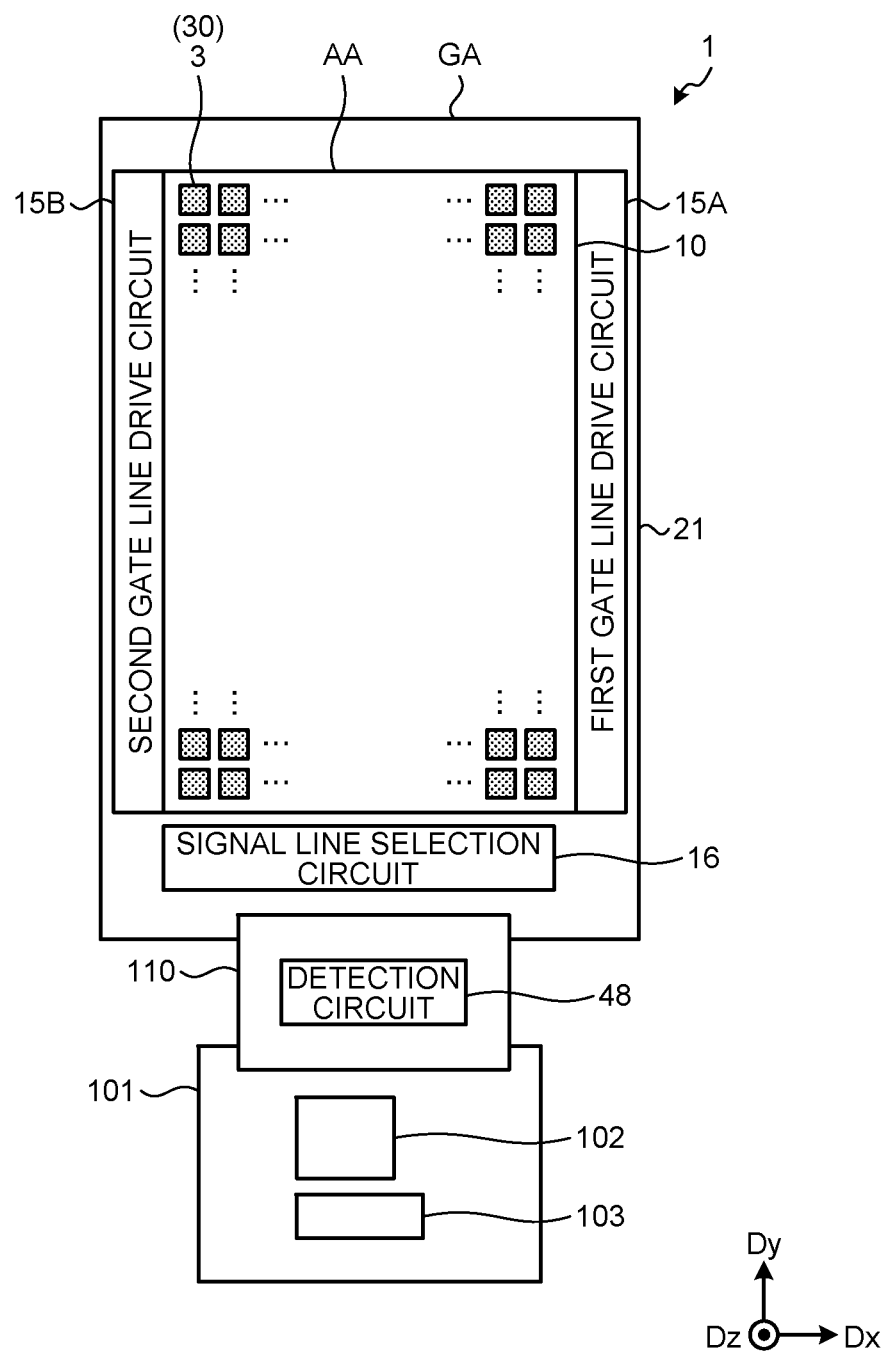
FIG. 3 is a plan view illustrating the detection device according to the embodiment.

FIG. 3 is a plan view illustrating the detection device according to the embodiment. As illustrated in FIG. 3, the detection device 1 includes a substrate 21, a sensor unit 10, a first gate line drive circuit 15A, a second gate line drive circuit 15B, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor unit 10, the first gate line drive circuit 15A, the second gate line drive circuit 15B, and the signal line selection circuit 16 to control a detection operation of the sensor unit 10. The power supply circuit 103 supplies voltage signals including, for example, a power supply potential Vsf and a reference potential Vcom (refer to FIG. 5) to the sensor unit 10, the first gate line drive circuit 15A, the second gate line drive circuit 15B, and the signal line selection circuit 16.

The substrate 21 has the detection area AA and a peripheral area GA. The detection area AA is an area overlapping a plurality of detection elements 3 included in the sensor unit 10. The peripheral area GA is an area outside the detection area AA, and is an area not overlapping the detection elements 3. That is, the peripheral area GA is an area between the outer perimeter of the detection area AA and the ends of the substrate 21. The first gate line drive circuit 15A, the second gate line drive circuit 15B, and the signal line selection circuit 16 are provided in the peripheral area GA.

Each of the detection elements 3 of the sensor unit 10 is a photosensor including a photoelectric conversion element 30. The photoelectric conversion element 30 is a photodiode, and outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection area AA. The photoelectric conversion element 30 included in each of the detection elements 3 performs the detection according to gate drive signals (for example, a reset control signal RST and a read control signal RD) supplied from the first gate line drive circuit 15A and the second gate line drive circuit 15B. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the detection elements 3.

The first gate line drive circuit 15A, the second gate line drive circuit 15B, and the signal line selection circuit 16 are provided in the peripheral area GA. Specifically, the first gate line drive circuit 15A and the second gate line drive circuit 15B are provided in an area extending along a second direction Dy in the peripheral area GA. The signal line selection circuit 16 is provided in an area extending along a first direction Dx in the peripheral area GA, and is provided between the sensor unit 10 and the detection circuit 48. The first gate line drive circuit 15A and the second gate line drive circuit 15B are arranged with the detection area AA interposed therebetween in the first direction Dx. The first gate line drive circuit 15A and the second gate line drive circuit 15B are not limited to this configuration, and may be formed as one circuit and arranged along one side of the detection area AA.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

Figure 4:
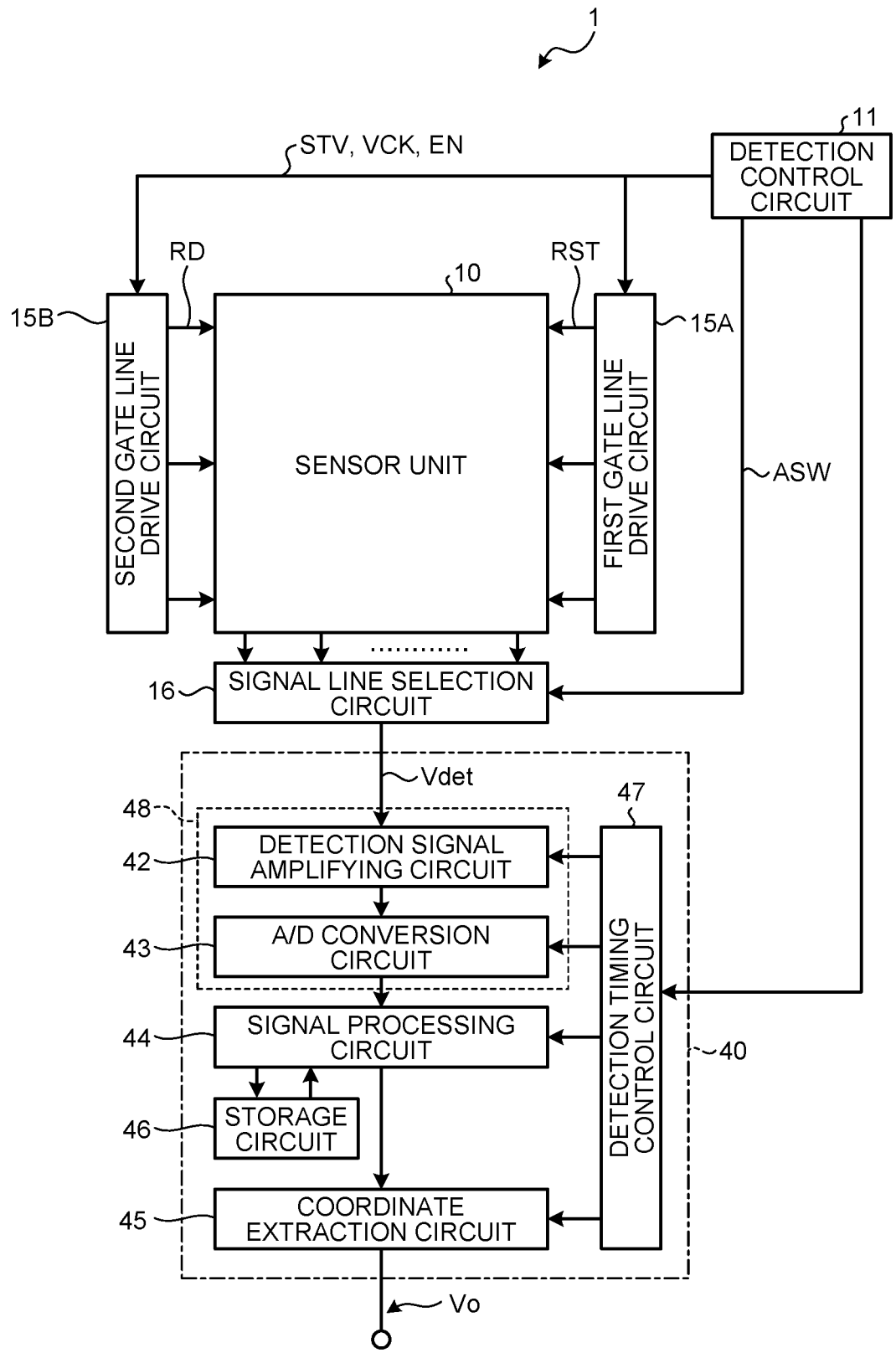
FIG. 4 is a block diagram illustrating a configuration example of the detection device according to the embodiment.

FIG. 4 is a block diagram illustrating a configuration example of the detection device according to the embodiment. As illustrated in FIG. 4, the detection device 1 further includes a detection control circuit 11 and a detector 40. One, some, or all of the functions of the detection control circuit 11 are included in the control circuit 102. One, some, or all of the functions of the detector 40 other than those of the detection circuit 48 are also included in the control circuit 102.

The detection control circuit 11 is a circuit that supplies respective control signals to the first gate line drive circuit 15A, the second gate line drive circuit 15B, the signal line selection circuit 16, and the detector 40 to control operations thereof. The detection control circuit 11 supplies various control signals including, for example, a start signal STV, a clock signal VCK, and an enable signal EN to the first gate line drive circuit 15A and the second gate line drive circuit 15B. The detection control circuit 11 also supplies various control signals including, for example, a selection signal ASW to the signal line selection circuit 16.

The first gate line drive circuit 15A and the second gate line drive circuit 15B are circuits that drive a plurality of gate lines (read control scan lines GLrd and reset control scan lines GLrst (refer to FIG. 5)) based on the various control signals. The first gate line drive circuit 15A and the second gate line drive circuit 15B sequentially or simultaneously select the gate lines, and supply the gate drive signals (for example, the reset control signals RST and the read control signals RD) to the selected gate lines. Through this operation, the first gate line drive circuit 15A and the second gate line drive circuit 15B select the photoelectric conversion elements 30 coupled to the gate lines.

Figure 5:
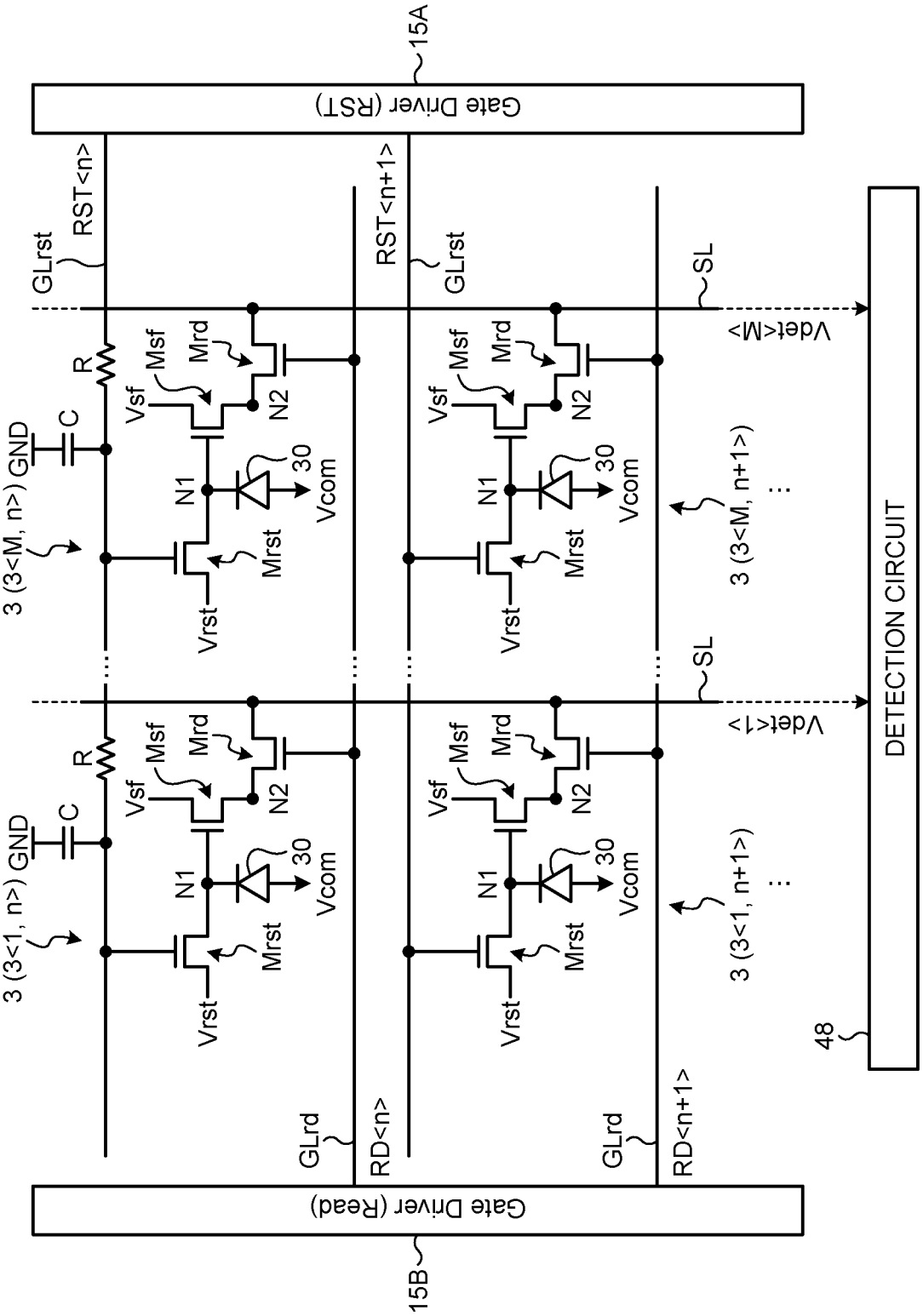
FIG. 5 is a circuit diagram illustrating a plurality of detection elements.

The signal line selection circuit 16 is a switch circuit that sequentially or simultaneously selects a plurality of output signal lines SL (refer to FIG. 5). The signal line selection circuit 16 is, for example, a multiplexer. The signal line selection circuit 16 couples the selected output signal lines SL to the detection circuit 48 based on the selection signals ASW supplied from the detection control circuit 11. Through this operation, the signal line selection circuit 16 outputs the detection signals Vdet of the photoelectric conversion elements 30 to the detector 40. The signal line selection circuit 16 may be omitted. In this case, the output signal lines SL may be directly coupled to the detection circuit 48.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity received by the sensor unit 10 based on output signals of the detection circuit 48. The signal processing circuit 44 can detect the fingerprint that is the asperities on the surface of the finger Fg based on the signals from the detection circuit 48 when the finger Fg is in contact with or in proximity to a detection surface. The signal processing circuit 44 may detect the information on the living body based on the signals from the detection circuit 48. Examples of the information on the living body include the blood vessel image, the pulse wave, the pulsation, and a blood oxygen saturation level of the finger Fg. In the present embodiment, the detection device treats the finger Fg (fingerprint) as an object to be detected (detection target). However, the object to be detected is not limited to the finger Fg, and may be any part as long as it is a part of the living body, such as a palm, a wrist, or a sole.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example and an operation example of the detection device 1. FIG. 5 is a circuit diagram illustrating the detection elements. As illustrated in FIG. 5, each of the detection elements 3 includes the photoelectric conversion element 30, a reset transistor Mrst, a read transistor Mrd, and a source follower transistor Msf. The detection elements 3 are provided with the reset control scan lines GLrst and the read control scan lines GLrd as detection drive lines (gate lines), and provided with the output signal lines SL as wiring for reading signals.

The reset control scan lines GLrst, the read control scan lines GLrd, and the output signal lines SL are each coupled to the detection elements 3. Specifically, the reset control scan lines GLrst and the read control scan lines GLrd extend in the first direction Dx (refer to FIG. 3), and are each coupled to the detection elements 3 arranged in the first direction Dx. The output signal lines SL extend in the second direction Dy, and are coupled to the detection elements 3 arranged in the second direction Dy. The output signal lines SL are wiring from which signals from the transistors (read transistors Mrd and source follower transistors Msf) are output.

The reset transistor Mrst, the read transistor Mrd, and the source follower transistor Msf are provided correspondingly to each of the photoelectric conversion elements 30. Each of the transistors included in the detection element 3 is constituted by an n-type thin-film transistor (TFT). However, each of the transistors is not limited thereto, and may be constituted by a p-type TFT.

The reference potential Vcom is applied to the anode of the photoelectric conversion element 30. The cathode of the photoelectric conversion element 30 is coupled to a node N1. The node N1 is coupled to one of the source and the drain of the reset transistor Mrst, and to the gate of the source follower transistor Msf. When light irradiates the photoelectric conversion element 30, a signal (electric charge) output from the photoelectric conversion element 30 is stored in a capacitive element generated at the node N1.

The gate of the reset transistor Mrst is coupled to a corresponding one of the reset control scan lines GLrst. The other of the source and the drain of the reset transistor Mrst is supplied with a reset potential Vrst. When the reset transistor Mrst is turned on (into a conduction state) in response to the reset control signal RST supplied from the first gate line drive circuit 15A, the potential of the node N1 is reset to the reset potential Vrst. The reference potential Vcom has a potential lower than the reset potential Vrst, and the photoelectric conversion element 30 is driven in a reverse bias state.

The source follower transistor Msf is coupled between a terminal supplied with the power supply potential Vsf and the read transistor Mrd (node N2). The gate of the source follower transistor Msf is coupled to the node N1. The gate of the source follower transistor Msf is supplied with a signal (voltage) corresponding to the signal (electric charge) generated by the photoelectric conversion element 30. This operation causes the source follower transistor Msf to output a signal voltage corresponding to the signal (electric charge) generated by the photoelectric conversion element 30 to the read transistor Mrd.

The read transistor Mrd is coupled between the source of the source follower transistor Msf (node N2) and a corresponding one of the output signal lines SL. The gate of the read transistor Mrd is coupled to a corresponding one of the read control scan lines GLrd. When the read transistor Mrd is turned on in response to the read control signal RD supplied from the second gate line drive circuit 15B, the signal output from the source follower transistor Msf, that is, the signal (voltage) corresponding to the signal (electric charge) generated by the photoelectric conversion element 30 is output as the detection signal Vdet to the output signal line SL.

In FIG. 5, the reset transistor Mrst and the read transistor Mrd each have a single-gate structure. However, the reset transistor Mrst and the read transistor Mrd may each have what is called a double-gate structure constituted by two transistors coupled in series, or may be have a configuration constituted by three or more transistors coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 6:
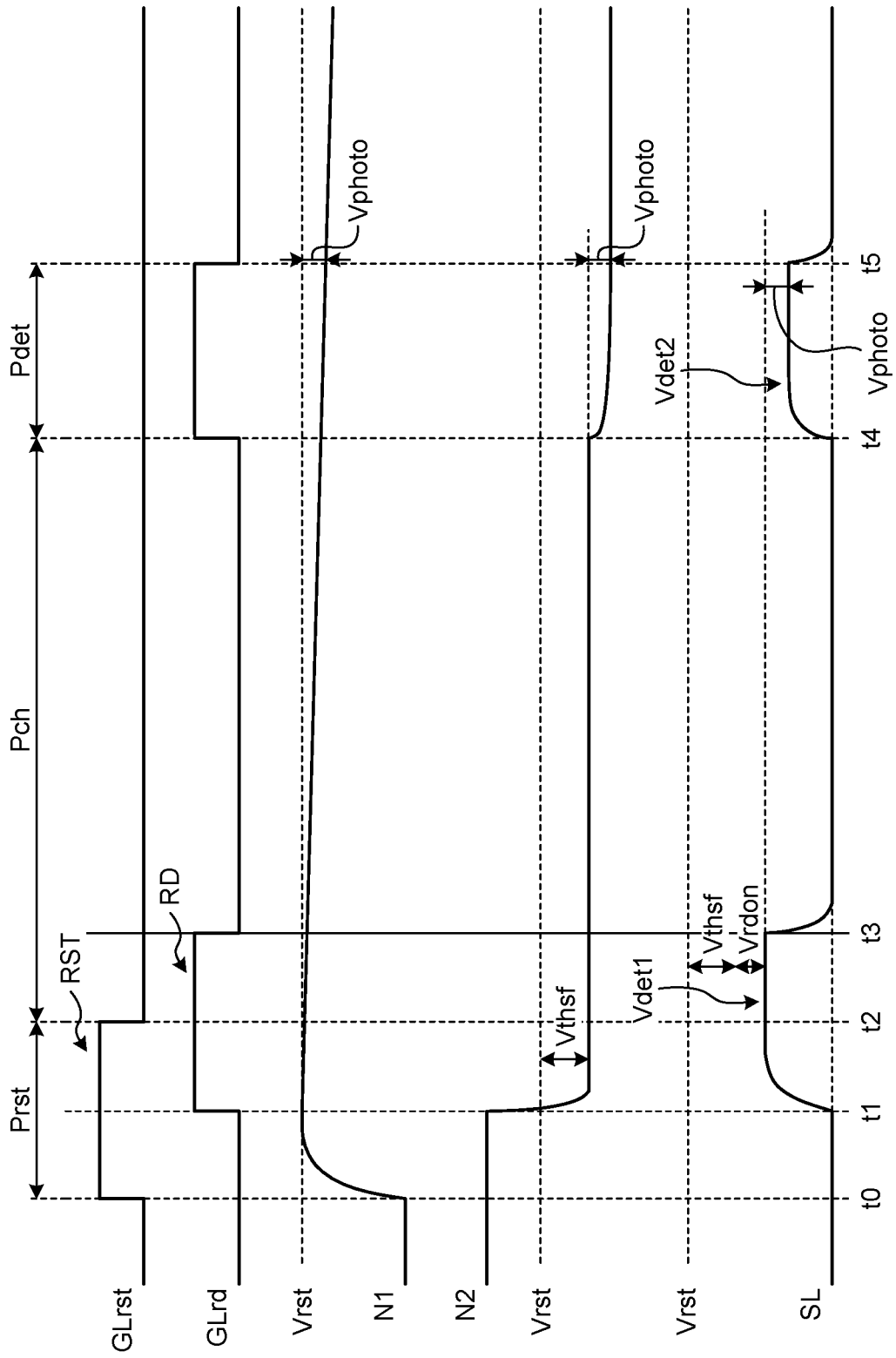
FIG. 6 is a timing waveform diagram illustrating an operation example of one of the detection elements.

FIG. 6 is a timing waveform diagram illustrating an operation example of the detection element. As illustrated in FIG. 6, the detection element 3 performs the detection in the order of a reset period Prst, a storage period Pch, and a read period Pdet. The power supply circuit 103 supplies the reference potential Vcom to the anode of the photoelectric conversion element 30 over the reset period Prst, the storage period Pch, and the read period Pdet.

At time t0, the control circuit 102 sets the reset control signal RST supplied to the reset control scan line GLrst to HIGH (high-level voltage) to start the reset period Prst. In the reset period Prst, the reset transistor Mrst is turned on (into the conduction state) to increase the potential of the node N1 to the reset potential Vrst. The read transistor Mrd is off (in a nonconduction state). Hence, the source of the source follower transistor Msf is charged by the power supply potential Vsf to increase the potential of the node N2.

At time t1, the control circuit 102 sets the read control signal RD supplied to the read control scan line GLrd to HIGH (high-level voltage). As a result, the read transistor Mrd is turned on (into the conduction state) to set the potential of the node N2 to (Vrst−Vthsf). Vthsf denotes a threshold voltage Vthsf of the source follower transistor Msf.

At time t2, the control circuit 102 sets the reset control signal RST to LOW (low-level voltage) to end the reset period Prst and start the storage period Pch. In the storage period Pch, the reset transistor Mrst is turned off (into the nonconduction state). The signal corresponding to the light irradiating the photoelectric conversion element 30 is stored to reduce the potential of the node N1 to (Vrst−Vphoto). Vphoto denotes a signal (voltage change amount) corresponding to the light irradiating the photoelectric conversion element 30.

At time t3, the potential of a detection signal Vdet1 output from the output signal line SL is set to (Vrst−Vthsf−Vrdon). Vrdon denotes a voltage drop caused by on-resistance of the read transistor Mrd.

At time t3, the control circuit 102 sets the read control signal RD to LOW (low-level voltage). As a result, the read transistor Mrd is turned off (into the nonconduction state) to set the potential of the node N2 to be constant at (Vrst−Vthsf). The output signal line SL is loaded so as to output the detection signal Vdet at LOW (low-level voltage).

At time t4, the control circuit 102 sets the read control signal RD to HIGH (high-level voltage). As a result, the read transistor Mrd is turned on (into the conduction state) to end the storage period Pch and start the read period Pdet. The potential of the node N2 changes to (Vrst−Vthsf−Vphoto) in response to the signal Vphoto. The potential of a detection signal Vdet2 output in the read period Pdet decreases by an amount of the signal Vphoto from the potential of the detection signal Vdet1 obtained at time t3 and is set to (Vrst−Vthsf−Vrdon−Vphoto).

The detector 40 can detect the light irradiating the photoelectric conversion element 30 based on the signal (Vphoto) of the difference between the detection signal Vdet1 at time t3 and the detection signal Vdet2 at time t5. While FIG. 6 illustrates the operation example of one of the detection elements 3, the first gate line drive circuit 15A and the second gate line drive circuit 15B can cause the detection elements 3 in the entire detection area AA to perform the detection by sequentially scanning the reset control scan lines GLrst and the read control scan lines GLrd in a time-division manner.

Figure 7:
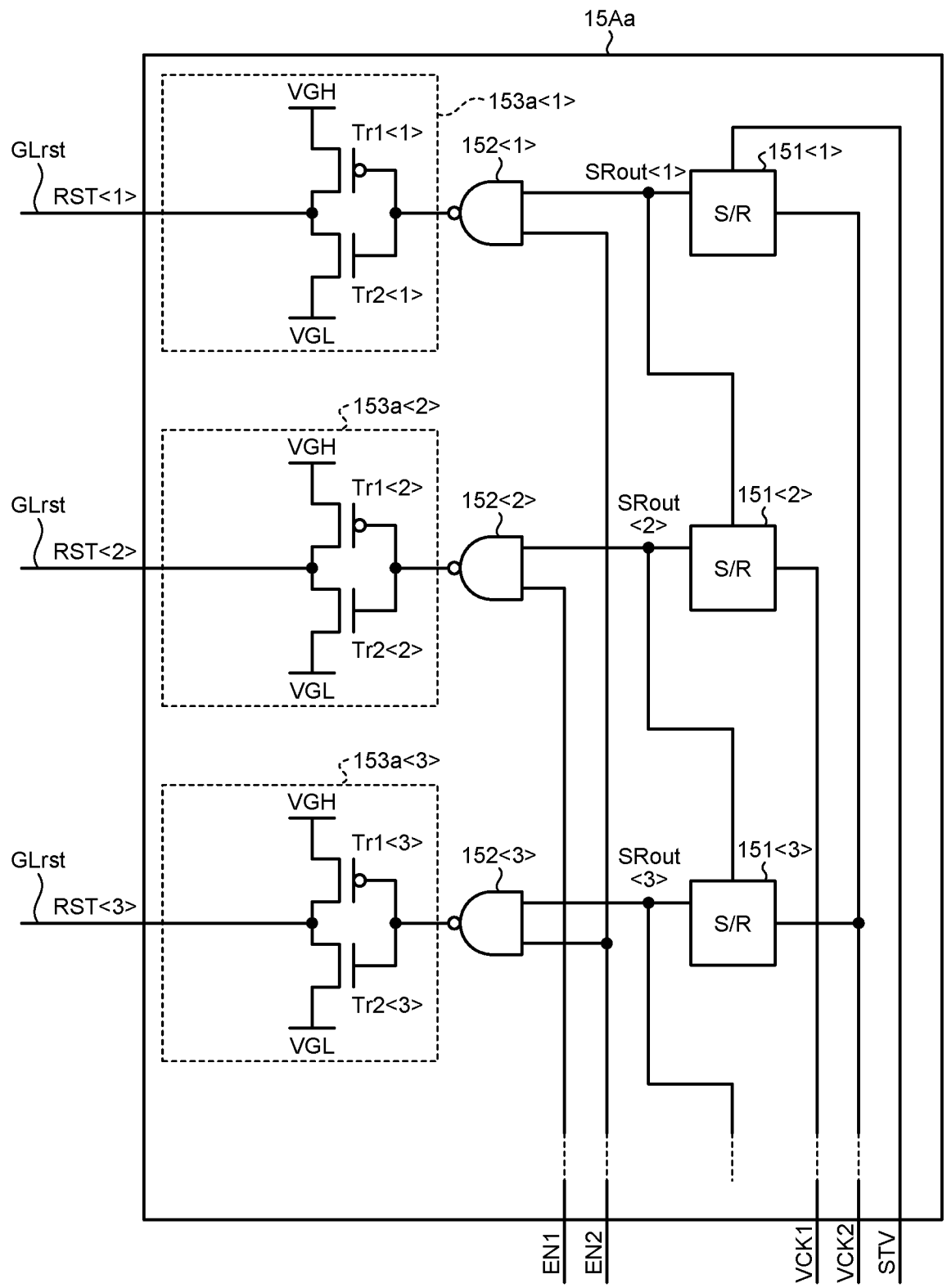
FIG. 7 is a diagram illustrating an example of a block configuration of a first gate line drive circuit according to a comparative example.
Figure 8:
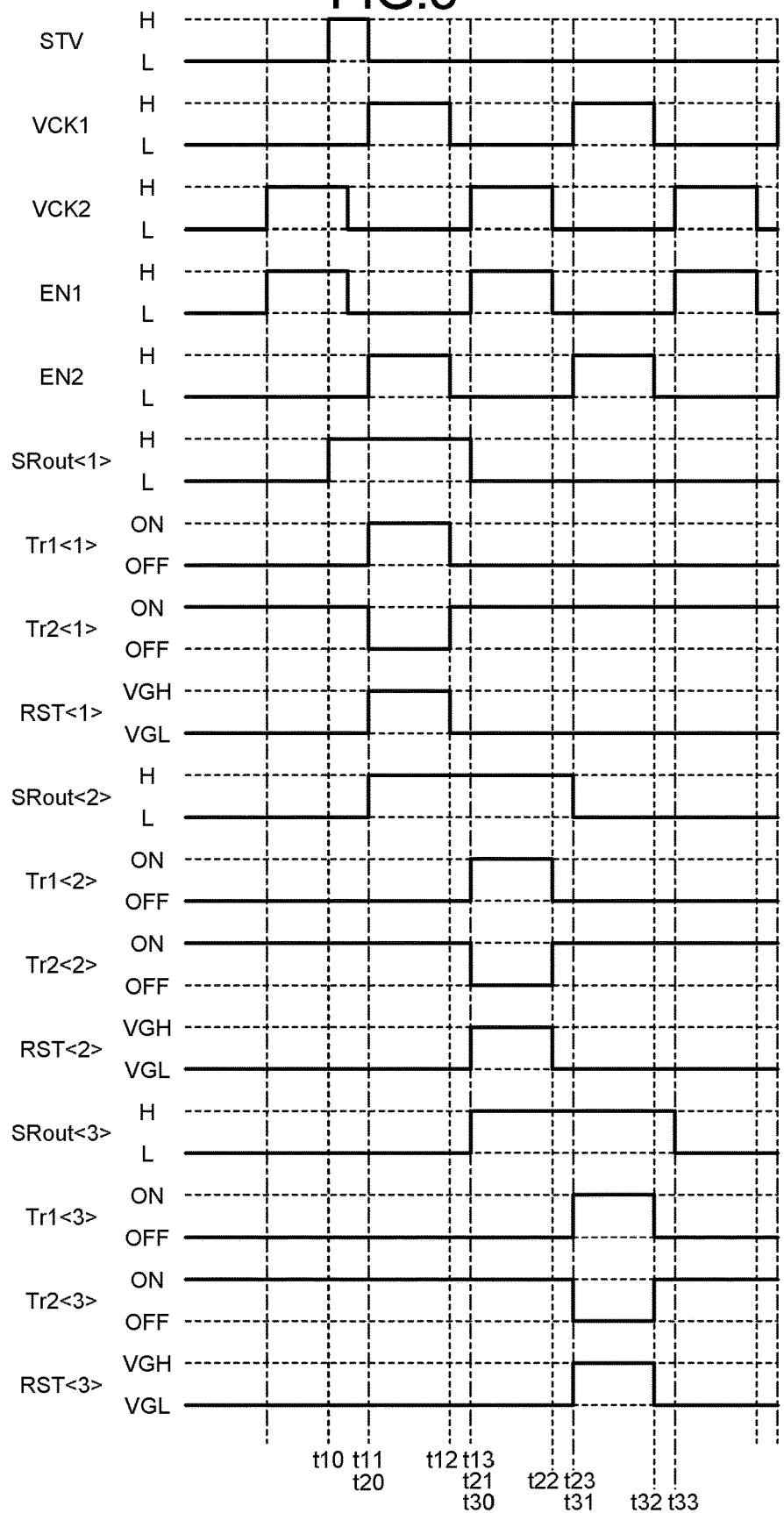
FIG. 8 is a timing diagram explaining an operation of the block configuration of the first gate line drive circuit according to the comparative example.

FIG. 7 is a diagram illustrating an example of a block configuration of a first gate line drive circuit according to a comparative example. FIG. 8 is a timing diagram explaining an operation of the block configuration of the first gate line drive circuit according to the comparative example, and particularly illustrates potential states of signals and transistors in the reset period Prst. A first gate line drive circuit 15Aa receives the start signal STV, clock signals VCK1 and VCK2, and enable signals EN1 and EN2 from the detection control circuit 11.

As illustrated in FIG. 7, the first gate line drive circuit 15Aa according to the comparative example includes shift registers (S/R) 151 each including a clocked inverter, negative AND (NAND) circuits 152, and reset transistor drive circuits 153a. When the clock signal VCK1 (VCK2) is "H" (high-level voltage), the clocked inverter of a shift register 151<n> takes in an output of a shift register 151<n−1> at the previous stage (start signal STV in the case of a shift register 151<1>), and when the clock signal VCK1 (VCK2) is "L" (low-level voltage), the clocked inverter of the shift register 151<n> holds the value using a latch operation in the shift register 151<n> while blocking the path for taking in the output of the shift register 151<n−1> (start signal STV in the case of the shift register 151<1>). The following describes the operation of the first gate line drive circuit 15Aa with reference to FIG. 7.

In each of the reset transistor drive circuits 153a, a first transistor Tr1 that is configured as a p-type TFT and applies a high potential (first potential) VGH to the reset control scan line GLrst is coupled in series to a second transistor Tr2 that is configured as an n-type TFT and applies a low potential (second potential) VGL lower than the high potential (first potential) VGH to the reset control scan line GLrst.

As illustrated in FIG. 8, at time t10, the clock signal VCK2 is "H" (high-level voltage) and the start signal STV is controlled to be "H" (high-level voltage) in the reset period Prst, which sets an output SRout<1> of the shift register 151<1> to "H" (high-level voltage).

Then, the clock signal VCK2 is set to "L" (low-level voltage). During a period when the clock signal VCK2 is "L", the action of the clocked inverter in the shift register 151<1> holds the output state of the shift register 151<1> until the clock signal VCK2 is next set to "H" (high-level voltage).

When the enable signal EN2 is controlled to be "H" (high-level voltage) at time t11, the NAND output of a NAND circuit 152<1> is set to "L" (low-level voltage). As a result, a first transistor Tr1<1> is controlled to be on and a second transistor Tr2<1> is controlled to be off to set a reset control signal RST<1> to the high potential VGH (first potential).

Then, when the enable signal EN2 is controlled to be "L" (low-level voltage) at time t12, the NAND output of the NAND circuit 152<1> is set to "H" (high-level voltage). As a result, the first transistor Tr1<1> is controlled to be off and the second transistor Tr2<1> is controlled to be on to set the reset control signal RST<1> to the low potential VGL (second potential). Further, when the clock signal VCK2 is controlled to be "H" (high-level voltage) at time t13, the output SRout<1> of the shift register 151<1> is set to "L" (low-level voltage). The output SRout<1> is supplied to a shift register 151<2>.

At time t20 (t11), the output SRout<1> of the shift register 151<1> is "H" (high-level voltage) and the clock signal VCK1 is controlled to be "H" (high-level voltage), which sets an output SRout<2> of the shift register 151<2> to "H" (high-level voltage).

Then, the clock signal VCK1 is set to "L". During a period when the clock signal VCK1 is "L", the action of the clocked inverter in the shift register 151<2> holds the output state of the shift register 152<1> until the clock signal VCK1 is next set to "H".

When the enable signal EN1 is controlled to be "H" (high-level voltage) at time t21, the NAND output of a NAND circuit 152<2> is set to "L" (low-level voltage). As a result, a first transistor Tr1<2> is controlled to be on and a second transistor Tr2<2> is controlled to be off to set a reset control signal RST<2> to the high potential VGH (first potential).

Then, when the enable signal EN1 is controlled to be "L" (low-level voltage) at time t22, the NAND output of the NAND circuit 152<2> is set to "H" (high-level voltage). As a result, the first transistor Tr1<2> is controlled to be off and the second transistor Tr2<2> is controlled to be on to set the reset control signal RST<2> to the low potential VGL (second potential). Further, when the clock signal VCK1 is controlled to be "H" (high-level voltage) at time t23, the output SRout<2> of the shift register 151<2> is set to "L" (low-level voltage). The output SRout<2> is supplied to a shift register 151<3>.

At time t30 (t13 and t21), the output SRout<2> of the shift register 151<2> is "H" (high-level voltage) and the clock signal VCK2 is controlled to be "H" (high-level voltage), which sets an output SRout<3> of the shift register 151<3> to "H" (high-level voltage).

Then, the clock signal VCK2 is set to "L". During a period when the clock signal VCK2 is "L", the action of the clocked inverter in the shift register 151<3> holds the output state of the shift register 151<3> until the clock signal VCK2 is next set to "H".

When the enable signal EN2 is controlled to be "H" (high-level voltage) at time t31, the NAND output of a NAND circuit 152<3> is set to "L" (low-level voltage). As a result, a first transistor Tr1<3> is controlled to be on and a second transistor Tr2<3> is controlled to be off to set a reset control signal RST<3> to the high potential VGH (first potential).

Then, when the enable signal EN2 is controlled to be "L" (low-level voltage) at time t32, the NAND output of the NAND circuit 152<3> is set to "H" (high-level voltage). As a result, the first transistor Tr1<3> is controlled to be off and the second transistor Tr2<3> is controlled to be on to set the reset control signal RST<3> to the low potential VGL (second potential). Further, when the clock signal VCK2 is controlled to be "H" (high-level voltage) at time t33, the output SRout<3> of the shift register 151<3> is set to "L" (low-level voltage). Thereafter, the same drive as the above is repeated by the subsequent groups of the shift register to the reset transistor drive circuit.

As illustrated in FIG. 5, the time constant of the reset control signal RST differs between the reset transistors Mrst of the detection elements 3 (3<1, n>, 3<1, n+1>) located at the left end of the detection area and the reset transistors Mrst of the detection elements 3(3<M, n>, 3<M, n+1>) located at the right end of the detection area due to wiring resistance R of the reset control scan lines GLrst and parasitic capacitance C generated between the reset control scan lines GLrst and other wiring and elements. Therefore, the reset transistors Mrst of the detection elements 3(3<1, n>, 3<1, n+1>) located at the left end in FIG. 5 behave differently from the reset transistors Mrst of the detection elements 3(3<M, n>, 3<M, n+1>) located at the right end in FIG. 5. The following describes the behavior of the reset transistors Mrst in the comparative example illustrated in FIGS. 7 and 8. While FIG. 5 illustrates the wiring resistance R and the parasitic capacitance C of only the reset control scan line GLrst supplied with a reset control signal RST<n>, the other reset control scan lines GLrst also have the wiring resistance R and the parasitic capacitance C.

Figure 9:
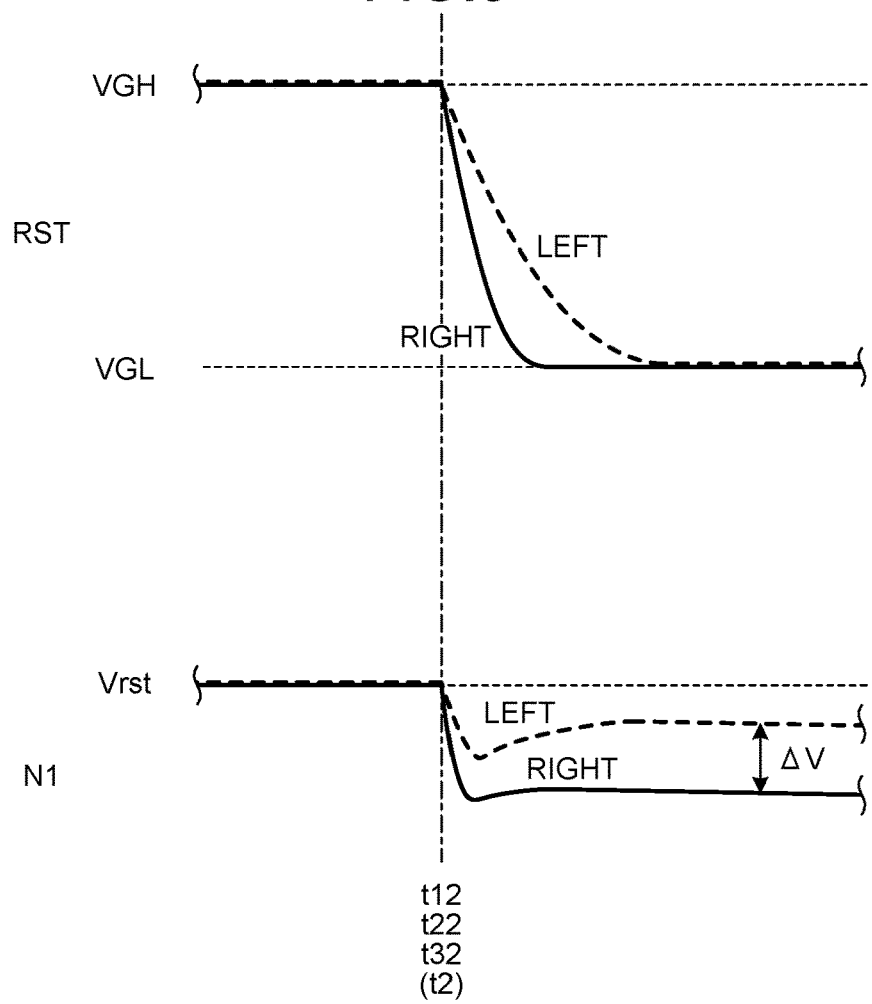
FIG. 9 is a diagram illustrating behavior of reset transistors during a reset period of the comparative example.
Figure 10:
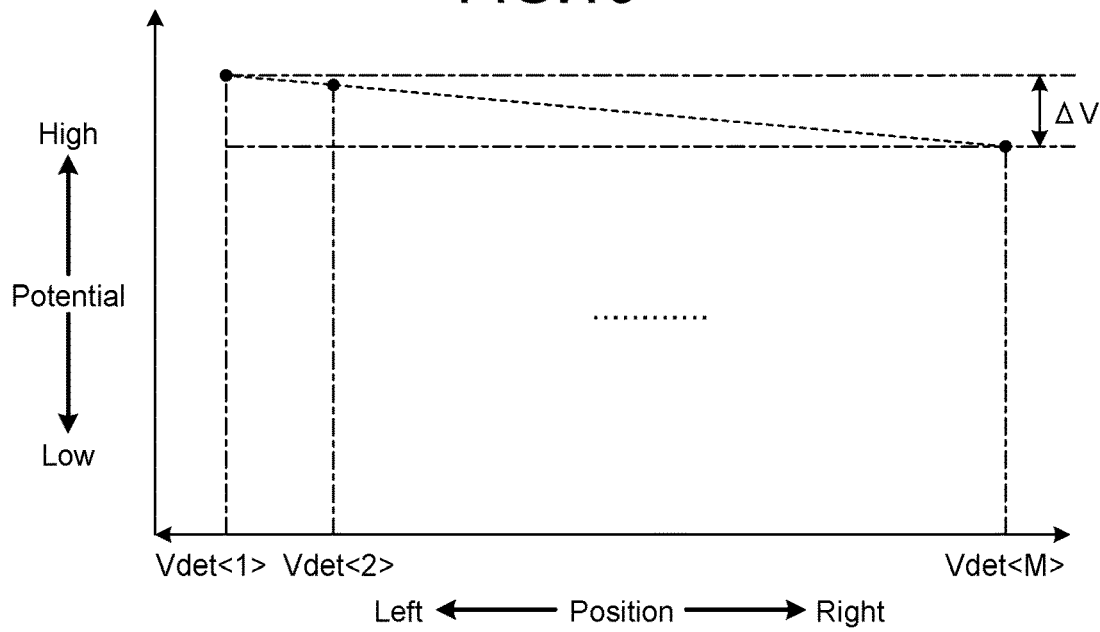
FIG. 10 is a schematic diagram illustrating a potential of a detection signal of the detection element in the comparative example.

FIG. 9 is a diagram illustrating the behavior of the reset transistors during the reset period of the comparative example. Solid lines illustrated in FIG. 9 indicate waveforms at portions in the detection elements 3 at the right end of FIG. 5, and dashed lines indicate waveforms at the portions in the detection elements 3 at the left end of FIG. 5. FIG. 10 is a schematic diagram illustrating the potential of the detection signal of the detection element in the comparative example.

As illustrated in FIG. 9, in the reset period Prst, the potential of the node N1 is reduced by an influence of gate coupling capacitance of the reset transistor Mrst at a falling edge of the reset control signal RST at each of times t12, t22, and t32 (refer to FIG. 8, corresponding to time t2 in FIG. 6), and increases again by being recharged before the reset transistor Mrst is fully turned off. At this time, the gate potential of the reset transistor Mrst of the detection element 3 on the reset control scan line GLrst at the right end in FIG. 5 falls more steeply than the gate potential of the reset transistor Mrst of the detection element 3 at the left end. In other words, since the gate potential of the reset transistor Mrst of the detection element 3 on the reset control scan line GLrst at the left end in FIG. 5 is more greatly affected by the wiring resistance R and the parasitic capacitance C of the reset control scan line GLrst, the gate potential of the reset transistor Mrst of the detection element 3 at the left end has a smaller time constant, and falls more slowly than the gate potential of the reset transistor Mrst of the detection element 3 at the right end.

Therefore, the amount of reduction in the potential of the node N1 due to the fall of the reset control signal RST is larger for the detection element 3 at the right end than for the detection element 3 at the left end in FIG. 5, and the amount of recharge before the reset transistor Mrst is fully turned off is larger for the detection element 3 at the left end than for the detection element 3 at the right end in FIG. 5.

As a result, as illustrated in FIG. 10, a potential difference ΔV between the potential of the detection signal Vdet output from each of the detection elements 3 on the reset control scan line GLrst arranged rightward from the left end in FIG. 5 and the potential of the detection signal Vdet output from the detection element 3 at the left end in FIG. 5 increases as the position of the detection element 3 moves rightward from the left end in FIG. 5. In other words, the potential of the detection signal Vdet decreases as the position of the detection element 3 moves rightward from the left end in FIG. 5.

Figure 11:
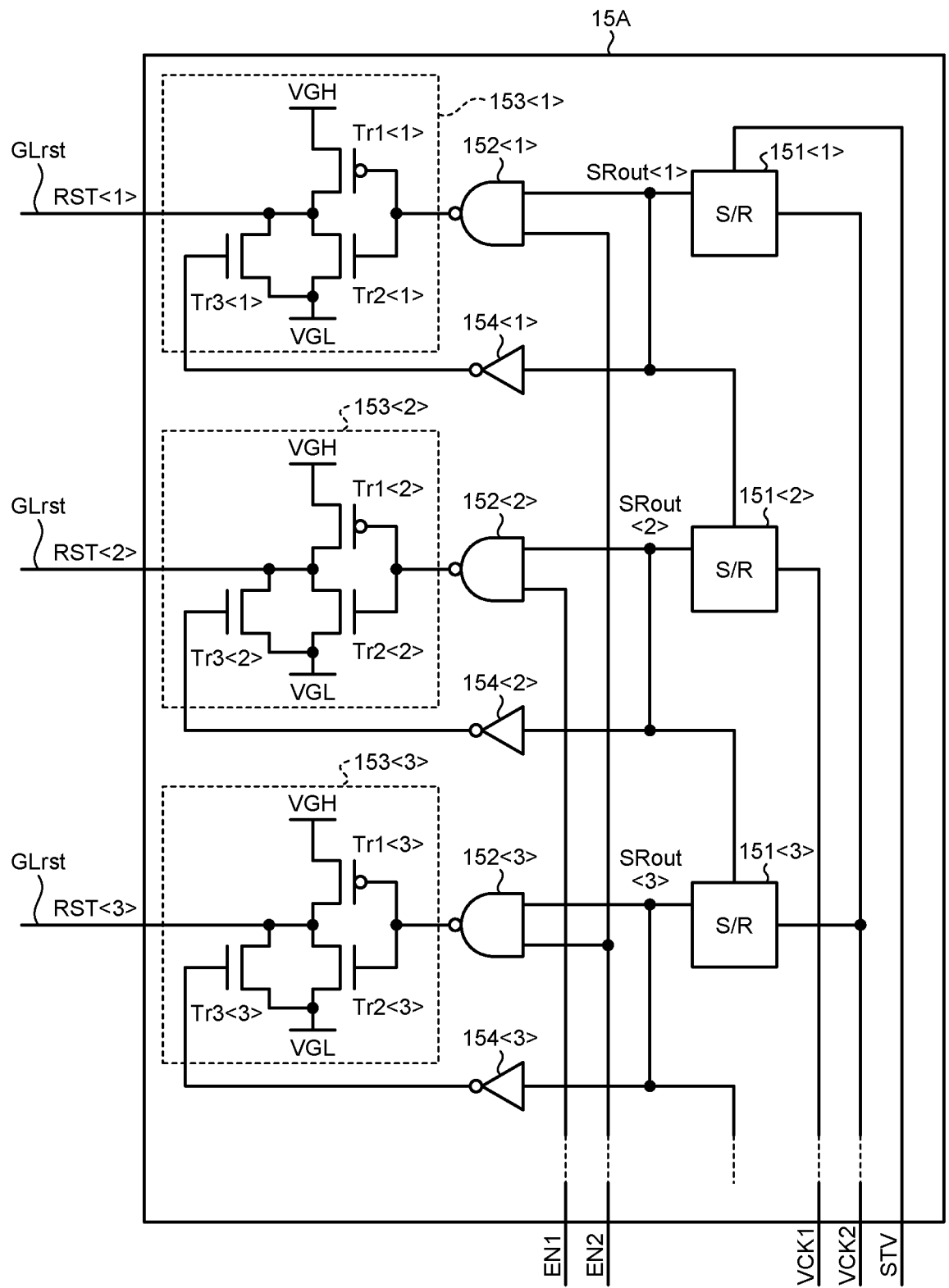
FIG. 11 is a diagram illustrating an example of a block configuration of a first gate line drive circuit according to the embodiment.
Figure 12:
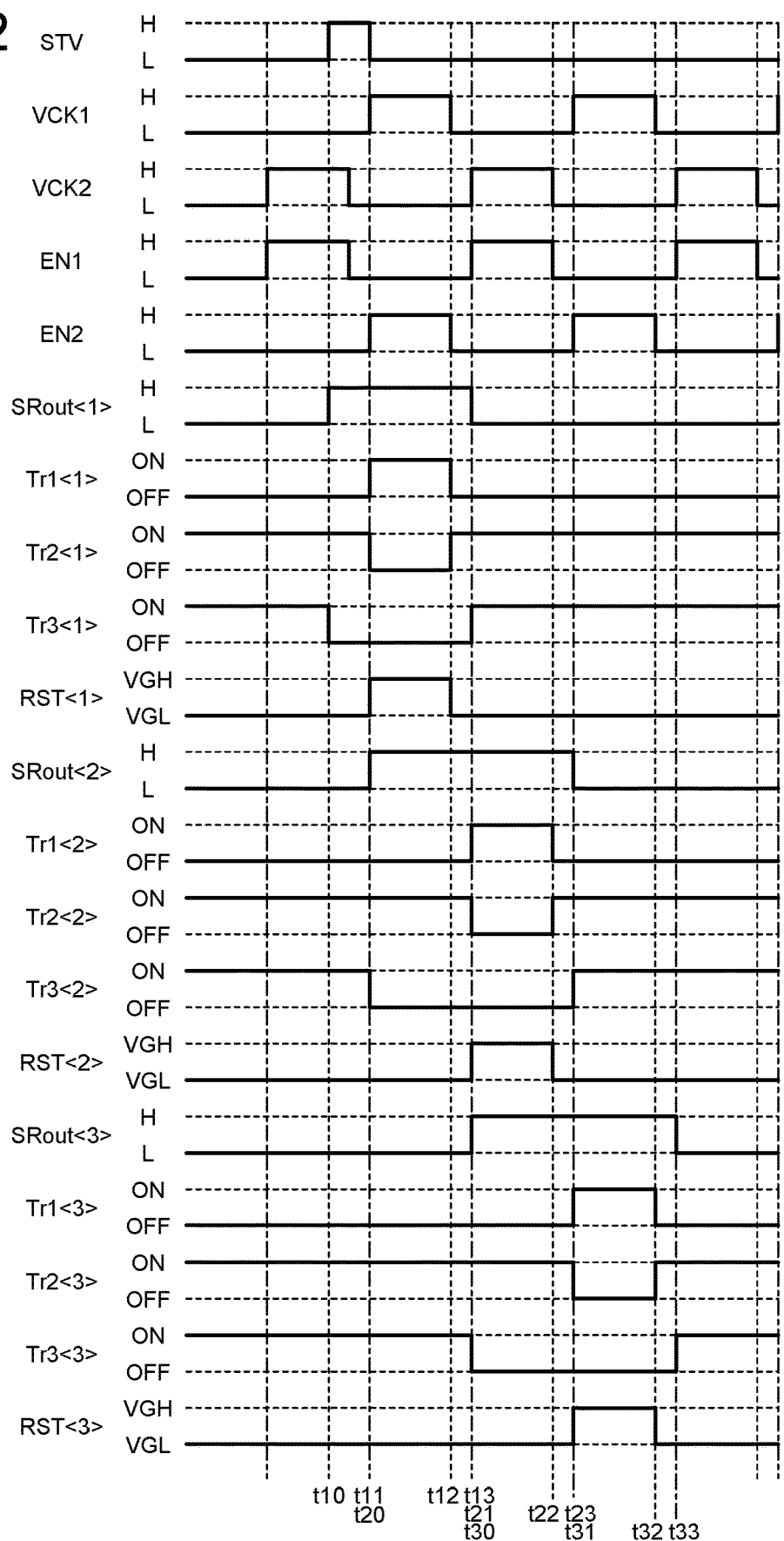
FIG. 12 is a timing diagram explaining an operation of the block configuration of the first gate line drive circuit according to the embodiment.

FIG. 11 is a diagram illustrating an example of a block configuration of the first gate line drive circuit according to the embodiment. FIG. 12 is a timing diagram explaining an operation of the block configuration of the first gate line drive circuit according to the embodiment.

As illustrated in FIG. 11, the first gate line drive circuit 15A according to the embodiment includes logical inversion circuits 154 in addition to the configuration of the comparative example illustrated in FIG. 7. Reset transistor drive circuits 153 each include a third transistor Tr3 that is configured as an n-type TFT and is coupled in parallel to the second transistor Tr2, in addition to the configuration of the comparative example illustrated in FIG. 7.

Each of the logical inversion circuits 154 is provided between the third transistor Tr3 and the output SRout of the shift register 151, and inverts the output from the shift register 151, and supplies the result to the third transistor Tr3. That is, the third transistor Tr3 is controlled to be on or off in synchronization with the output of the shift register 151, and is controlled to be off when the output of the shift register 151 is "H" (high-level voltage), or to be on when the output of the shift register 151 is "L" (low-level voltage).

As illustrated in FIG. 12, at time t10, the clock signal VCK2 is "H" (high-level voltage), and the start signal STV is controlled to be "H" (high-level voltage) in the reset period Prst. This operation sets the output SRout<1> of the shift register 151<1> to "H" (high-level voltage), and controls a third transistor Tr3<1> to be off.

Then, the clock signal VCK2 is set to "L" (low-level voltage). During a period when the clock signal VCK2 is "L", the action of the clocked inverter in the shift register 151<1> holds the output state of the shift register 151<1> until the clock signal VCK2 is next set to "H" (high-level voltage).

When the enable signal EN2 is controlled to be "H" (high-level voltage) at time t11, the NAND output of the NAND circuit 152<1> is set to "L" (low-level voltage). As a result, the first transistor Tr1<1> is controlled to be on and the second transistor Tr2<1> is controlled to be off to set the reset control signal RST<1> to the high potential VGH (first potential).

Then, when the enable signal EN2 is controlled to be "L" (low-level voltage) at time t12, the NAND output of the NAND circuit 152<1> is set to "H" (high-level voltage). As a result, the first transistor Tr1<1> is controlled to be off and the second transistor Tr2<1> is controlled to be on to set the reset control signal RST<1> to the low potential VGL (second potential). Further, when the clock signal VCK2 is controlled to be "H" (high-level voltage) at time t13, the output SRout<1> of the shift register 151<1> is set to "L" (low-level voltage). The output SRout<1> is supplied to the shift register 151<2>. At this time, the third transistor Tr3<1> is controlled to be on.

That is, in the first gate line drive circuit 15A according to the embodiment, after the third transistor Tr3<1> is controlled to be off at time t10, the first transistor Tr1<1> is controlled to be on and the second transistor Tr2<1> is controlled to be off at time t11, and after the first transistor Tr1<1> is controlled to be off and the second transistor Tr2<1> is controlled to be on at time t12, the third transistor Tr3<1> is controlled to be on at time t13. As a result, from time t10 to time t11 and from time t12 to time t13, only the second transistor Tr2<1> is placed in the on state among the second transistor Tr2<1> and the third transistor Tr3<1> that are coupled in parallel to each other.

At time t20 (t11), the output SRout<1> of the shift register 151<1> is "H" (high-level voltage), and the clock signal VCK1 is controlled to be "H" (high-level voltage). This operation sets the output SRout<2> of the shift register 151<2> to "H" (high-level voltage), and controls a third transistor Tr3<2> to be off.

Then, the clock signal VCK1 is set to "L". During a period when the clock signal VCK1 is "L", the action of the clocked inverter in the shift register 151<2> holds the output state of the shift register 152<1> until the clock signal VCK1 is next set to "H".

When the enable signal EN1 is controlled to be "H" (high-level voltage) at time t21, the NAND output of the NAND circuit 152<2> is set to "L" (low-level voltage). As a result, the first transistor Tr1<2> is controlled to be on and the second transistor Tr2<2> is controlled to be off to set the reset control signal RST<2> to the high potential VGH (first potential).

Then, when the enable signal EN1 is controlled to be "L" (low-level voltage) at time t22, the NAND output of the NAND circuit 152<2> is set to "H" (high-level voltage). As a result, the first transistor Tr1<2> is controlled to be off and the second transistor Tr2<2> is controlled to be on to set the reset control signal RST<2> to the low potential VGL (second potential). Further, when the clock signal VCK1 is controlled to be "H" (high-level voltage) at time t23, the output SRout<2> of the shift register 151<2> is set to "L" (low-level voltage). The output SRout<2> is supplied to the shift register 151<3>. At this time, the third transistor Tr3<2> is controlled to be on.

That is, in the first gate line drive circuit 15A according to the embodiment, after the third transistor Tr3<1> is controlled to be off at time t20, the first transistor Tr1<1> is controlled to be on and the second transistor Tr2<1> is controlled to be off at time t21, and after the first transistor Tr1<1> is controlled to be off and the second transistor Tr2<1> is controlled to be on at time t22, the third transistor Tr3<1> is controlled to be on at time t23. As a result, from time t20 to time t21 and from time t22 to time t23, only the second transistor Tr2<2> is placed in the on state among the second transistor Tr2<2> and the third transistor Tr3<2> that are coupled in parallel to each other.

At time t30 (t13 and t21), the output SRout<2> of the shift register 151<2> is "H" (high-level voltage) and the clock signal VCK2 is controlled to be "H" (high-level voltage). This operation sets the output SRout<3> of the shift register 151<3> to "H" (high-level voltage), and controls the third transistor Tr3<3> to be off.

Then, the clock signal VCK2 is set to "L". During a period when the clock signal VCK2 is "L", the action of the clocked inverter in the shift register 151<3> holds the output state of the shift register 151<3> until the clock signal VCK2 is next set to "H".

When the enable signal EN2 is controlled to be "H" (high-level voltage) at time t31, the NAND output of the NAND circuit 152<3> is set to "L" (low-level voltage). As a result, the first transistor Tr1<3> is controlled to be on and the second transistor Tr2<3> is controlled to be off to set the reset control signal RST<3> to the high potential VGH (first potential).

Then, when the enable signal EN2 is controlled to be "L" (low-level voltage) at time t32, the NAND output of the NAND circuit 152<3> is set to "H" (high-level voltage). As a result, the first transistor Tr1<3> is controlled to be off and the second transistor Tr2<3> is controlled to be on to set the reset control signal RST<3> to the low potential VGL (second potential). Further, when the clock signal VCK2 is controlled to be "H" (high-level voltage) at time t33, the output SRout<3> of the shift register 151<3> is set to "L" (low-level voltage). At this time, the third transistor Tr3<3> is controlled to be on.

That is, in the first gate line drive circuit 15A according to the embodiment, after the third transistor Tr3<1> is controlled to be off at time t30, the first transistor Tr1<1> is controlled to be on and the second transistor Tr2<1> is controlled to be off at time t31, and after the first transistor Tr1<1> is controlled to be off and the second transistor Tr2<1> is controlled to be on at time t32, the third transistor Tr3<1> is controlled to be on at time t33. As a result, from time t30 to time t31 and from time t32 to time t33, only the second transistor Tr2<3> is placed in the on state among the second transistor Tr2<3> and the third transistor Tr3<3> that are coupled in parallel to each other. Thereafter, the same drive as the above is repeated by the subsequent groups of the shift register to the reset transistor drive circuit.

Figure 13:
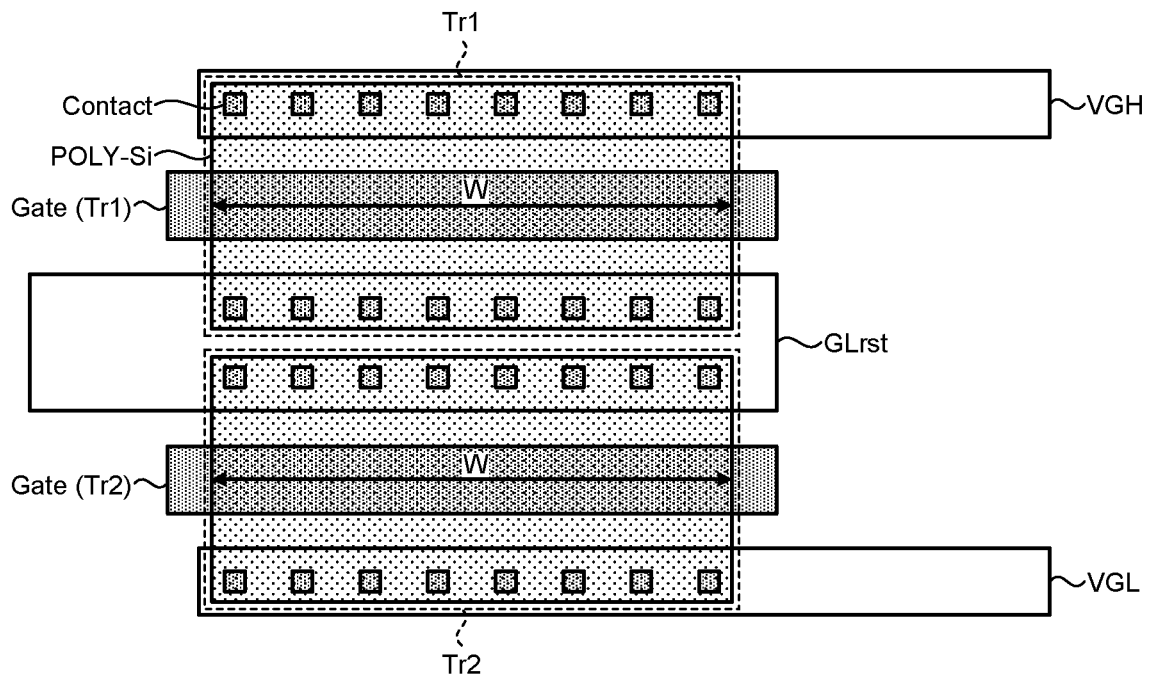
FIG. 13 is a plan view of a reset transistor drive circuit according to the comparative example.
Figure 14:
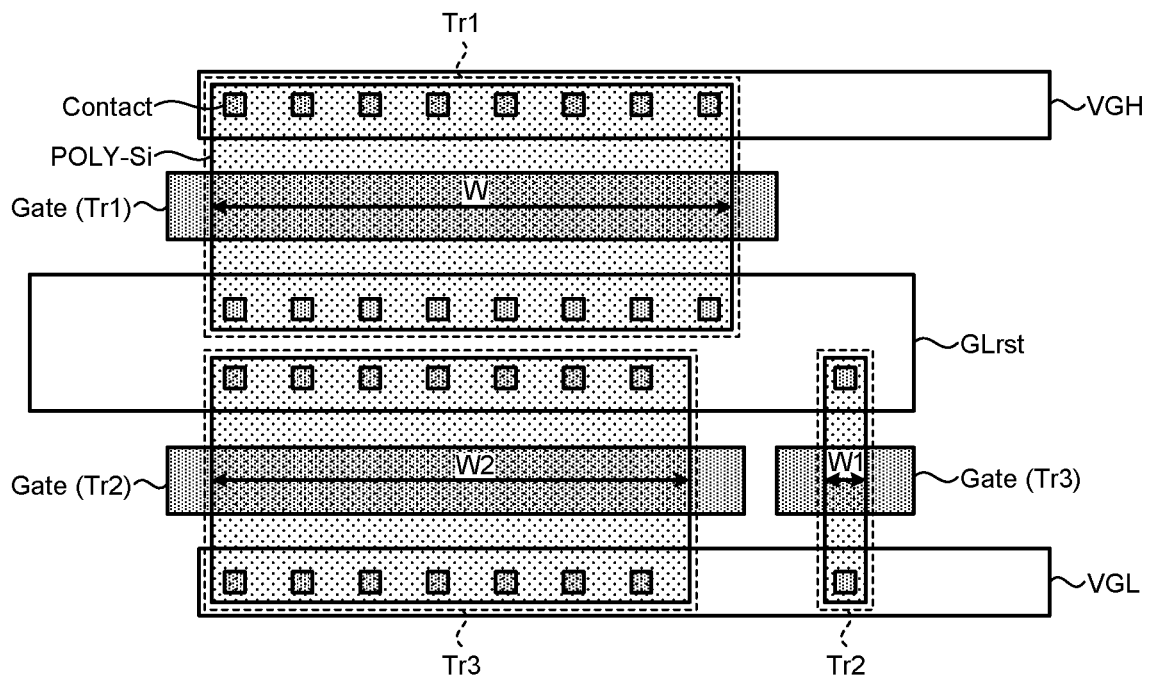
FIG. 14 is a plan view of a reset transistor drive circuit according to the embodiment.

FIG. 13 is a plan view of the reset transistor drive circuit according to the comparative example. FIG. 14 is a plan view of the reset transistor drive circuit according to the embodiment.

In each of the reset transistor drive circuits 153a according to the comparative example, a channel width W of the first transistor Tr1 is equal to the channel width W of the second transistor Tr2, as illustrated in FIG. 13.

In contrast, in each of the reset transistor drive circuits 153 according to the embodiment, as illustrated in FIG. 14, the channel width W of the first transistor Tr1 is equal to the channel width W of the first transistor Tr1 of the reset transistor drive circuit 153a according to the comparative example, and the relations among the channel width W of the first transistor Tr1, a channel width W1 of the second transistor Tr2, and a channel width W2 of the third transistor Tr3 are represented by Expressions (1) and (2) below.

$$W = W1 + W2 \qquad (1)$$

$$W1 < W2 \qquad (2)$$

This configuration increases the on-resistance of the second transistor Tr2. Specifically, the channel width W1 of the second transistor Tr2 is preferably, for example, the minimum value or an approximate value of a value specified by a design rule for the substrate 21 constituting the sensor unit 10.

Figure 15:
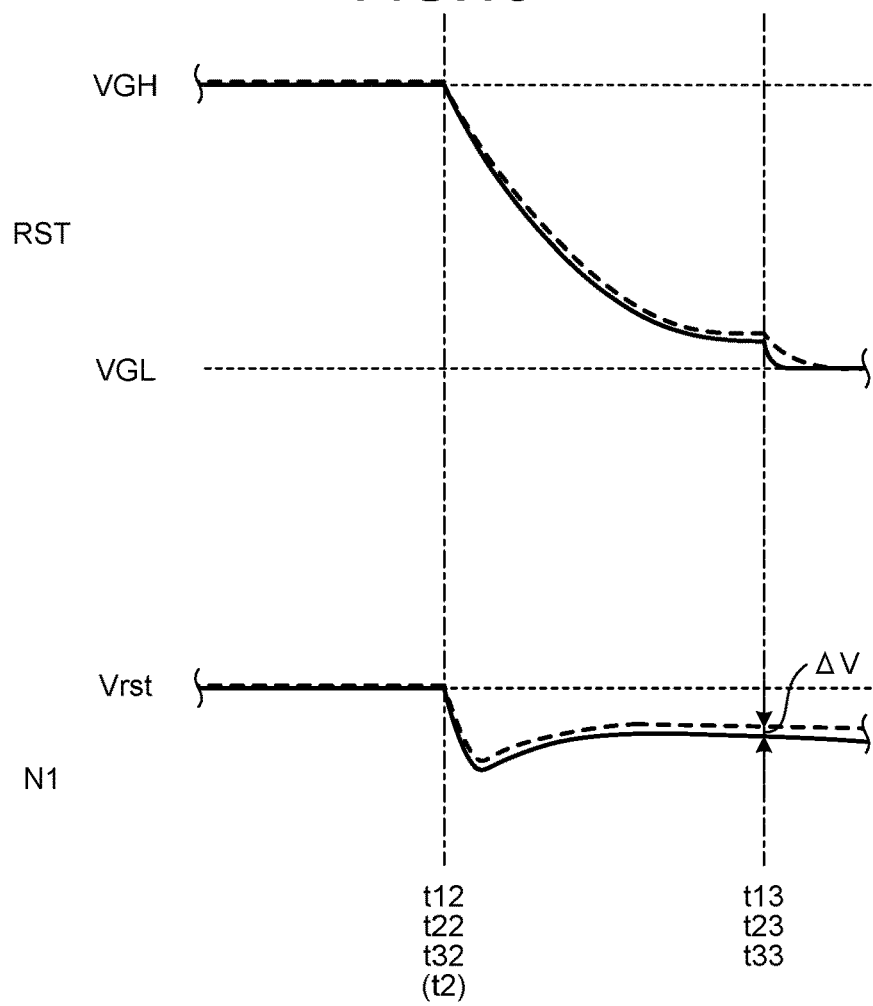
FIG. 15 is a diagram illustrating the behavior of the reset transistors during the reset period of the embodiment.
Figure 16:
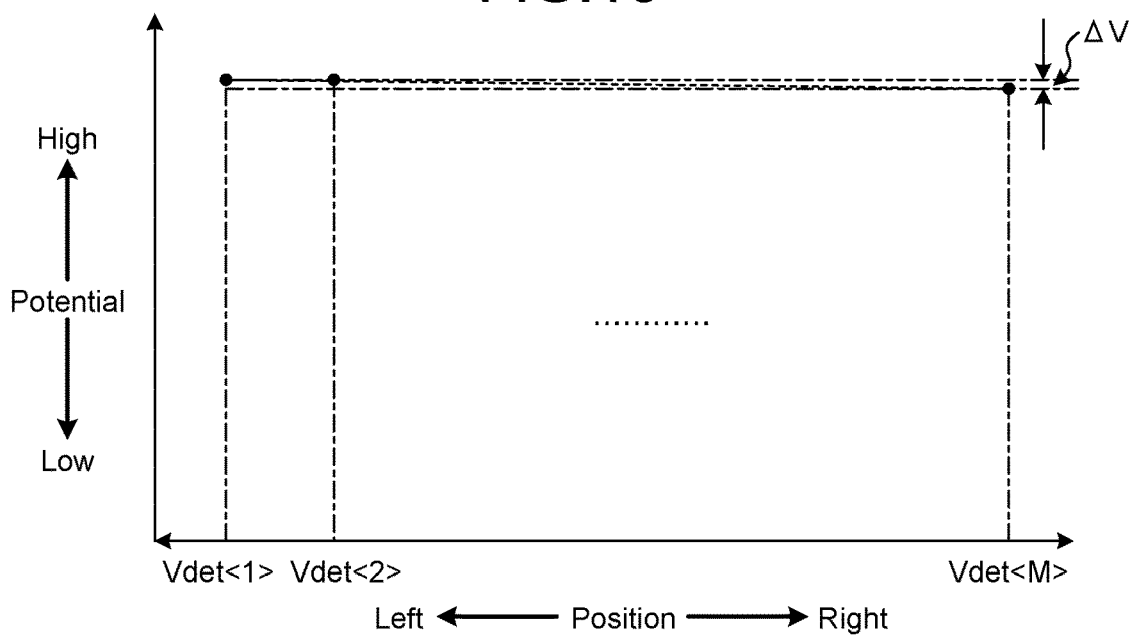
FIG. 16 is a schematic diagram illustrating the potential of the detection signal of the detection element in the embodiment.

FIG. 15 is a diagram illustrating the behavior of the reset transistors during the reset period of the embodiment. Solid lines illustrated in FIG. 15 indicate waveforms at portions in the detection elements 3 at the right end of FIG. 5, and dashed lines indicate waveforms at the portions in the detection elements 3 at the left end of FIG. 5. FIG. 16 is a schematic diagram illustrating the potential of the detection signal of the detection element in the embodiment.

In the reset transistor drive circuit 153 according to the embodiment, as described above, during the periods from time t12 to time t13, from time t22 to time t23, and from time t32 to time t33, only the second transistor Tr2 having relatively larger on-resistance is placed in the on state among the second transistor Tr2 and the third transistor Tr3 that serve as a switch circuit for supplying the low potential (second potential) VGL to the reset control scan line GLrst. As a result, the supply of the low potential (second potential) VGL to the reset control scan line GLrst, that is, the fall of the gate potential (potential of the reset control signal RST) in the reset control scan line GLrst is moderated particularly in an initial stage of the falling period. As a result, the difference in time constant caused by the wiring resistance R and the parasitic capacitance C can be reduced between the right and left ends in FIG. 5 on the reset control scan line GLrst, and, as illustrated in FIG. 15, the difference in the amount of reduction in the potential of the node N1 due to the fall of the reset control signal RST and the difference in the amount of recharge before the reset transistor Mrst is fully turned off can be reduced between the right and left ends in FIG. 5 on the reset control scan line GLrst.

As a result, as illustrated in FIG. 16, the potential difference ΔV between the potential of the detection signal Vdet output from each of the detection elements 3 on the reset control scan line GLrst arranged rightward from the left end in FIG. 5 and the potential of the detection signal Vdet output from the detection element 3 at the left end in FIG. 5 can be made smaller than that in the comparative example illustrated in FIG. 10.

Since the third transistor Tr3 is controlled to be on at time t13, time t23, and time t33, the potential of the reset control scan line GLrst can be held at the low potential (second potential) VGL during the storage period Pch, and thereby can reduce variations in potential of the node N1.

Figure 17:
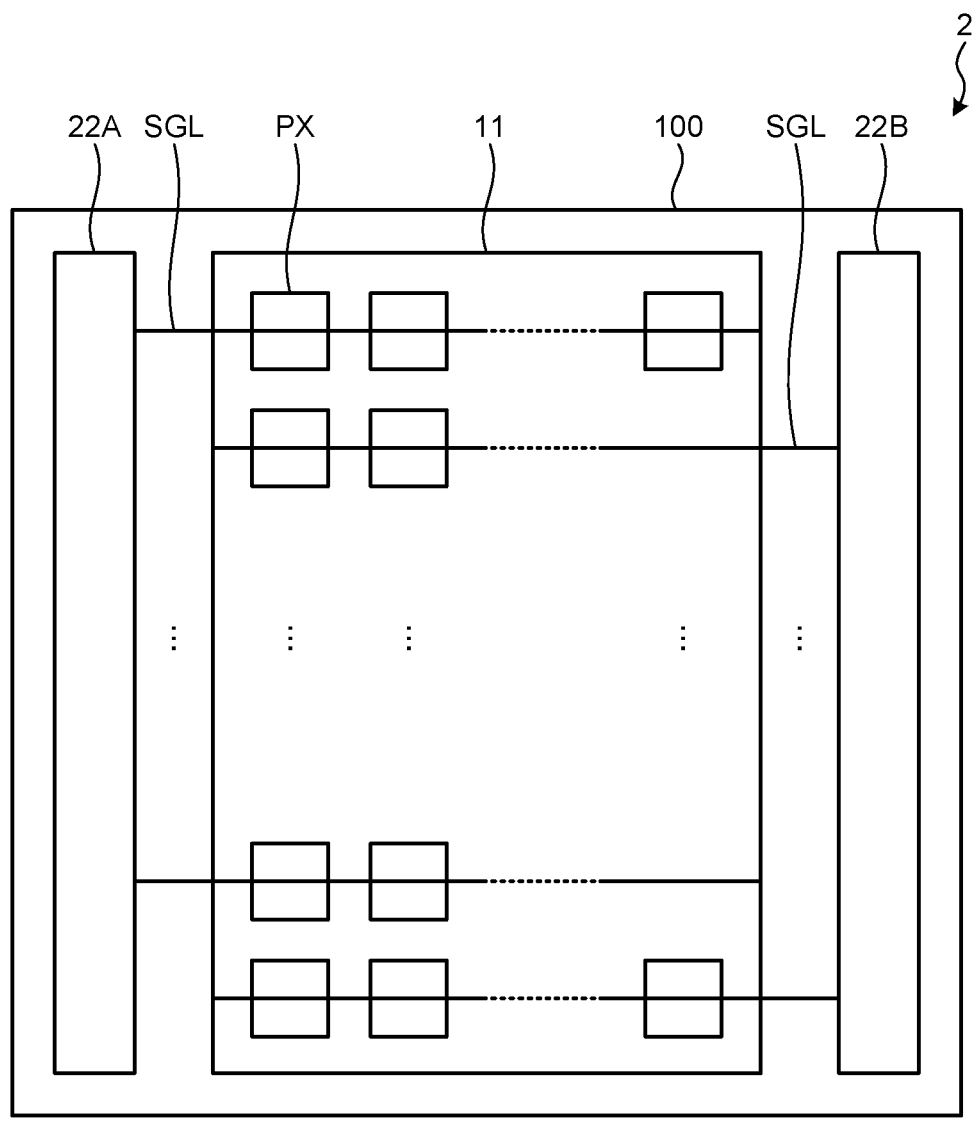
FIG. 17 is a plan view of an example of a display device to which the present disclosure is applicable.

While the preferred embodiment of the present disclosure has been described above, the present disclosure is not limited to the embodiment described above. FIG. 17 is a plan view of an example of a display device to which the present disclosure is applicable.

For example, as illustrated in FIG. 17, the structure of the present disclosure can be used for a display panel 100 of a display device 2. Any display panel 100 can be employed as the display panel 100 as long as having a configuration including a plurality of gate lines (scan lines) SGL that drive pixel transistors provided in pixels (display elements) PX in a display area 11 and gate line drive circuits 22A and 22B that supply gate signals to the gate lines SGL. In the example illustrated in FIG. 17, the gate line drive circuits 22A and 22B are provided along both sides of the display area 11. For example, the gate line drive circuit 22A on the left side drives the pixel transistors of the pixels PX in odd-numbered rows, and the gate line drive circuit 22B on the right side drives the pixel transistors of the pixels PX in even-numbered rows. The present disclosure is not limited to the example illustrated in FIG. 17. For example, in an aspect of the present disclosure, one gate line drive circuit may be provided along one side of the display area 11.

Specific examples of the display panel 100 include those provided with self-luminous display elements DL, such as organic EL elements, micro-LEDs, or mini-LEDs, as the pixels, and those provided with display elements, such as liquid crystal elements or electrophoretic elements, as the pixels. The display panel 100 can naturally be employed with other drive circuits that are required to scan.

The content of the present disclosure is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A detection device comprising:
   detection elements;
   reset control scan lines each coupled to a first group of the detection elements that are arranged in a first direction;
   a drive circuit configured to drive the reset control scan lines;
   output signal lines each coupled to a second group of the detection elements that are arranged in in a second direction different from the first direction; and
   a detection circuit configured to receive detection signals from the detection elements through the output signal lines, wherein
   each of the reset control scan lines is configured to supply a reset control signal to the first group of the detection elements, and
   the drive circuit comprises:
      a first transistor configured to apply a first potential to a corresponding one of the reset control scan lines;
      a second transistor that is coupled in series to the first transistor, and is configured to apply a second potential lower than the first potential to the corresponding one of the reset control scan lines; and
      a third transistor that is coupled in parallel to the second transistor, and is configured to apply the second potential to the corresponding one of the reset control scan lines.

2. The detection device according to claim 1, wherein a channel width of the second transistor is smaller than that of the third transistor.

3. The detection device according to claim 1, wherein the drive circuit is configured to control the third transistor to be off, and then, control the first transistor to be on and the second transistor to be off.

4. The detection device according to claim 1, wherein the drive circuit is configured to control the first transistor to be off and the second transistor to be on, and then, control the third transistor to be on.

5. The detection device according to claim 1, wherein the drive circuit comprises:
   the first transistor configured as a p-type thin-film transistor (TFT), and the second and the third transistors configured as n-type TFTs;
   a shift register;
   a negative AND (NAND) circuit configured to calculate a negative AND between an output of the shift register and an enable signal; and
   a logical inversion circuit configured to logically invert the output of the shift register,
   gates of the first and the second transistors are configured to receive an output of the NAND circuit, and
   a gate of the third transistor is configured to receive an output of the logical inversion circuit.

6. The detection device according to claim 5, wherein the drive circuit is configured to control to turn on or off the third transistor in synchronization with the output of the shift register.

7. The detection device according to claim 5, wherein the enable signal is configured to be controlled to be changed from a low-level voltage to a high-level voltage, and then to the low-level voltage, in a period when the output of the shift register is at a high-level voltage.

8. The detection device according to claim 1, wherein the detection elements each comprise:
- a photoelectric conversion element configured to store a signal corresponding to light irradiating the photoelectric conversion element;
- a reset transistor configured to apply a reset potential to a cathode of the photoelectric conversion element;
- a source follower transistor configured to output a signal corresponding to a potential generated by the photoelectric conversion element; and
- a read transistor configured to read an output signal of the source follower transistor, and output each of the detection signals.

9. A detection device comprising:
detection elements;
reset control scan lines each coupled to a group of the detection elements that are arranged in a first direction;
a drive circuit configured to drive the reset control scan lines; and
a detection circuit configured to receive detection signals from the detection elements, wherein
each of the reset control scan lines is configured to supply a reset control signal to the group of the detection elements, and
the drive circuit comprises:
- a first transistor configured to apply a first potential to a corresponding one of the reset control scan lines;
- a second transistor that is coupled in series to the first transistor; and
- a third transistor that is coupled in parallel to the second transistor.

10. The detection device according to claim 9, wherein the second transistor is configured to apply a second potential lower than the first potential to the corresponding one of the reset control scan lines.

11. The detection device according to claim 10, wherein the third transistor is configured to apply the second potential to the corresponding one of the reset control scan lines.

12. The detection device according to claim 9, wherein the third transistor is configured to apply a second potential to the corresponding one of the reset control scan lines.

13. The detection device according to claim 9, wherein a channel width of the second transistor is smaller than that of the third transistor.

14. The detection device according to claim 9, wherein the drive circuit is configured to control the third transistor to be off, and then, control the first transistor to be on and the second transistor to be off.

15. The detection device according to claim 9, wherein the drive circuit is configured to control the first transistor to be off and the second transistor to be on, and then, control the third transistor to be on.

16. The detection device according to claim 9, wherein the drive circuit comprises:
- the first transistor configured as a p-type thin-film transistor (TFT), and the second and the third transistors configured as n-type TFTs;
- a shift register;
- a negative AND (NAND) circuit configured to calculate a negative AND between an output of the shift register and an enable signal; and
- a logical inversion circuit configured to logically invert the output of the shift register,
gates of the first and the second transistors are configured to receive an output of the NAND circuit, and
a gate of the third transistor is configured to receive an output of the logical inversion circuit.

17. The detection device according to claim 16, wherein the drive circuit is configured to control to turn on or off the third transistor in synchronization with the output of the shift register.

18. The detection device according to claim 9, wherein the detection elements each comprise:
- a photoelectric conversion element configured to store a signal corresponding to light irradiating the photoelectric conversion element;
- a reset transistor configured to apply a reset potential to a cathode of the photoelectric conversion element;
- a source follower transistor configured to output a signal corresponding to a potential generated by the photoelectric conversion element; and
- a read transistor configured to read an output signal of the source follower transistor, and output each of the detection signals.

* * * * *